(12) United States Patent
Huang et al.

(10) Patent No.: US 11,515,168 B2
(45) Date of Patent: *Nov. 29, 2022

(54) CAPACITIVELY COUPLED PLASMA ETCHING APPARATUS

(71) Applicant: Advanced Micro-Fabrication Equipment Inc. China, Shanghai (CN)

(72) Inventors: Yunwen Huang, Shanghai (CN); Tuqiang Ni, Shanghai (CN); Jie Liang, Shanghai (CN); Jinlong Zhao, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 282 days.

This patent is subject to a terminal disclaimer.

(21) Appl. No.: 16/716,431

(22) Filed: Dec. 16, 2019

(65) Prior Publication Data
US 2020/0194276 A1    Jun. 18, 2020

(30) Foreign Application Priority Data
Dec. 17, 2018 (CN) .......................... 201811544979.3

(51) Int. Cl.
*H01L 21/00* (2006.01)
*H01L 21/311* (2006.01)
(Continued)

(52) U.S. Cl.
CPC .. *H01L 21/31116* (2013.01); *H01J 37/32091* (2013.01); *H01J 37/32532* (2013.01); *H01L 21/67069* (2013.01); *H01J 37/32449* (2013.01)

(58) Field of Classification Search
None
See application file for complete search history.

(56) References Cited

U.S. PATENT DOCUMENTS 5,210,466 A * 5/1993 Collins ................ C23C 16/509
156/345.44
5,348,497 A * 9/1994 Nitescu ............. H01J 37/32577
411/373
(Continued)

FOREIGN PATENT DOCUMENTS

JP        2000286242 A * 10/2000 ......... H01L 21/3065

*Primary Examiner* — Sylvia Macarthur
*Assistant Examiner* — Michelle Crowell
(74) *Attorney, Agent, or Firm* — Womble Bond Dickinson (US) LLP; Joseph Bach, Esq.

(57) ABSTRACT

Disclosed is a capacitively coupled plasma etching apparatus, wherein an electrically conductive supporting rod where a lower electrode is fixed is connected to driving means, the driving means driving the electrically conductive support rod to move axially; besides, the lower electrode is fixed to the bottom of a chamber body via a retractable sealing part, causing the upper surface of the lower electrode to be hermetically sealed in an accommodation space in the chamber body; an electrical connection part is connected on the chamber body; the radio frequency current in the chamber body returns, via the electrical connection part, to the loop end of a radio frequency matcher. In this way, the lower electrode is fixed on the chamber body via the retractable sealing part, such that when the lower electrode is driven by the driving means to move up/down, the chamber body does not move along with it, and the radio frequency loop in the chamber body is in a steady state, thereby achieving stability of the radio frequency loop while implementing adjustability of the plate distance.

9 Claims, 1 Drawing Sheet

(51) Int. Cl.
*H01J 37/32* (2006.01)
*H01L 21/67* (2006.01)

(56) References Cited

U.S. PATENT DOCUMENTS

| | | | | |
|---|---|---|---|---|
| 5,772,833 | A | 6/1998 | Inazawa et al. | |
| 6,221,221 | B1* | 4/2001 | Al-Shaikh | H01J 37/32577 |
| | | | | 204/298.02 |
| 6,349,670 | B1* | 2/2002 | Nakano | H01J 37/32082 |
| | | | | 118/723 E |
| 6,673,196 | B1 | 1/2004 | Oyabu | |
| 7,186,315 | B2 | 3/2007 | Himori et al. | |
| 8,485,128 | B2* | 7/2013 | Kellogg | H01L 21/6719 |
| | | | | 118/732 I |
| 2006/0021701 | A1* | 2/2006 | Tobe | H01J 37/32357 |
| | | | | 156/345.31 |
| 2008/0274297 | A1* | 11/2008 | Furuta | H01J 37/32568 |
| | | | | 427/569 |
| 2009/0200268 | A1* | 8/2009 | Tappan | H01L 21/6719 |
| | | | | 216/67 |
| 2011/0100552 | A1* | 5/2011 | Dhindsa | H01J 37/32642 |
| | | | | 156/345.1 |
| 2013/0128409 | A1* | 5/2013 | Nam | H01J 37/32091 |
| | | | | 361/234 |
| 2014/0127911 | A1* | 5/2014 | Shih | C25D 7/02 |
| | | | | 438/710 |
| 2015/0083042 | A1* | 3/2015 | Kobayashi | H01J 37/32082 |
| | | | | 118/500 |
| 2016/0240426 | A1* | 8/2016 | Kamath | H01J 37/32082 |
| 2017/0365449 | A1* | 12/2017 | Cui | C23C 16/4585 |
| 2019/0341231 | A1* | 11/2019 | Weichart | C23C 16/4558 |
| 2020/0194230 | A1* | 6/2020 | Huang | H01L 21/68792 |
| 2020/0194276 | A1* | 6/2020 | Huang | H01L 21/31116 |

\* cited by examiner

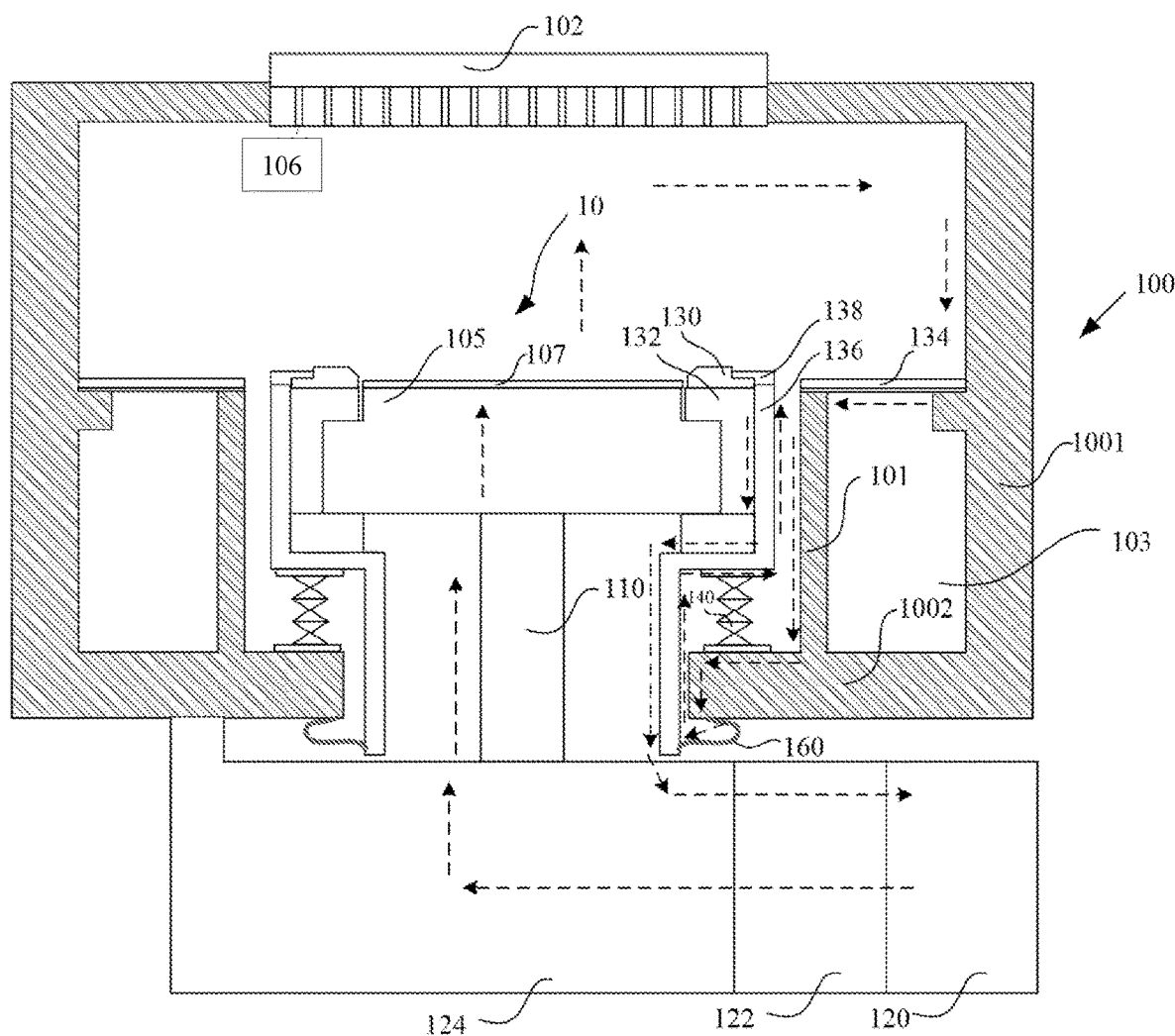

CAPACITIVELY COUPLED PLASMA ETCHING APPARATUS

RELATED APPLICATION

This application claims priority benefit from Chinese Patent Application No. 201811544979.3 filed Dec. 17, 2018, the disclosure of which is hereby incorporated herein by reference in its entirety.

FIELD

The present disclosure relates to semiconductor processing equipment, and more particularly relates to a capacitively coupled plasma etching apparatus.

BACKGROUND

A capacitively coupled plasma processing apparatus refers to an apparatus which generates plasma by radio frequency coupled discharging and then utilizes the plasma to perform processes such as deposition and etching, wherein the plate distance between plasma-generating electrodes is a critical parameter; particularly, with the ever higher requirements on processes of a plasma etching apparatus, it is needed to implement different etching steps under different plate distances. However, the plate distance in conventional plasma etching apparatuses is fixed and non-adjustable, while because electrodes serve as part of a radio frequency loop, stability of the radio-frequency loop should be taken into consideration in order to achieve adjustability of plate distance.

SUMMARY

In view of the above, an objective of the present disclosure is to provide a capacitively coupled plasma etching apparatus, which may achieve adjustability of plate distance between electrodes while maintaining radio-frequency loop stability.

To achieve the objective above, the present disclosure provides a technical solution below:

A capacitively coupled plasma etching apparatus comprises:

a chamber body, which includes a side wall and a bottom wall, the bottom wall having an opening;

an upper electrode disposed in the chamber body;

a base arranged opposite to the upper electrode and disposed in the chamber body, the base comprising a lower electrode, the lower electrode being fixed to an electrically conductive supporting rod and disposed above the opening, the base being fixed to the bottom wall of the chamber body via a retractable sealing part, causing the upper surface of the lower electrode to be hermetically sealed in an accommodation space where the chamber body is accommodated;

driving means fixed to a lower end of the electrically conductive support rod, the driving means driving the electrically conductive supporting rod to move axially, the driving means being connected to an output end and a loop end of the radio frequency matcher, respectively; and an electrical connection part connected to the chamber body, radio frequency current in the chamber body returning, via the electrical connection part, to the loop end.

Optionally, the base further comprises a dielectric ring fixed to the outer side of the lower electrode and an inner electrically conductive ring fixed to the outer side of the dielectric ring; the electrically connection part is an electrically conductive strip, the electrically conductive strip being connected between the bottom wall of the chamber body and the inner electrically conductive ring, the length of the electrically conductive strip being adapted to the movable amount of the retractable sealing part; the inner electrically conductive ring is fixed to the retractable sealing part, a gap being provided between the inner electrically conductive ring and a radio frequency return path disposed at the inner side of the chamber body; the radio frequency current first flows through the electrically conductive strip, then sequentially through the outer side and the inner side of the inner electrically conductive ring, and then returns to the loop end from the driving means.

Optionally, the capacitively coupled plasma etching apparatus further comprises a grounding ring, the grounding ring being disposed on the bottom wall of the chamber body, a cavity being provided between the grounding ring and the side wall, and the grounding ring being part of the radio frequency return path.

Optionally, the capacitively coupled plasma etching apparatus further comprises a plasma confinement ring disposed above the cavity, the plasma confinement ring and the cavity forming an exhaust cavity; and the plasma confinement ring comprises an electrically conductive part, the electrically conductive part causing the radio frequency current to enter the grounding ring from the side wall of the chamber body through the plasma confinement ring.

Optionally, the electrically conductive strip is a copper strip.

Optionally, the retractable sealing part is a bellow seal.

Optionally, an electrostatic chuck is disposed on the lower electrode, the dielectric ring surrounding the side wall of the lower electrode, and a focus ring surrounding the electrostatic chuck is further provided on the dielectric ring.

Optionally, the capacitively coupled plasma etching apparatus further comprises an edge ring surrounding the focus ring.

Optionally, the radio frequency matcher is provided in one or plurality, the plurality of radio frequency matchers having different frequencies and powers.

Optionally, the capacitively coupled plasma etching apparatus further comprises a radio frequency filter, the radio frequency filter being electrically connected between the driving means and the radio frequency matcher so as to serve as a radio frequency current output path and the radio frequency return path.

Embodiments of the present disclosure discloses a capacitively coupled plasma etching apparatus, wherein the electrically conductive supporting rod where the lower electrode is fixed is connected to the driving means, the driving means driving the electrically conductive support rod to move axially; besides, the lower electrode is fixed to the bottom of the chamber body via a retractable sealing part, causing the upper surface of the lower electrode to be hermetically sealed in an accommodation space of the chamber body; an electrical connection part is connected on the chamber body; the radio frequency current in the chamber body returns to the loop end of a radio frequency matcher via the electrical connection part. In this way, the lower electrode is fixed on the chamber body via the retractable sealing part, such that when the lower electrode is driven by the driving means to move up/down, the chamber body does not move along with it, and the radio frequency loop in the chamber body is in a steady state, thereby achieving stability of the radio frequency loop while maintaining adjustability of the plate distance.

BRIEF DESCRIPTION OF THE DRAWINGS

To elucidate the technical solutions of the present disclosure or the prior art, the drawings used in describing the embodiments of the present disclosure or the prior art will be briefly introduced below. It is apparent that the drawings as described only relate to some embodiments of the present disclosure. To those skilled in the art, other drawings can be derived based on these drawings without exercise of inventive work, wherein:

FIG. 1 illustrates a sectional structural schematic diagram of a capacitively coupled plasma etching apparatus according to the embodiments of the present disclosure.

DETAILED DESCRIPTION OF EMBODIMENTS

To make the objective, features, and advantages of the present disclosure more clearly and comprehensibly, the preferred embodiments of the present disclosure will be described in detail below with reference to the accompanying drawings.

Many details will be illustrated below to facilitate sufficient understanding of the present disclosure. However, the present disclosure may also adopt other different embodiments to implement. Without departing from the idea of the present disclosure, those skilled in the art may make similar extensions. Therefore, the present disclosure is not limited to the preferred embodiments described below.

FIG. 1 illustrates a sectional structural schematic diagram of a capacitively coupled plasma etching apparatus according to the embodiments of the present disclosure. The plasma etching apparatus has a reaction chamber. The reaction chamber is a hermetically sealed space enclosed by the chamber body 100 and other essential components, such that a wafer may completely undergo the etching process in the vacuum environment of the reaction chamber.

In the chamber body 100, an upper electrode 102 and a base 10 arranged opposite to the upper electrode 102 are disposed; the base 10 comprises a lower electrode 105, the lower electrode 105 being fixed on an electrically conductive supporting rod 110; a lower end of the electrically conductive supporting rod 110 is fixed to driving means 124, the driving means 124 driving the electrically conductive supporting rod 110 to move axially, the driving means 124 being electrically connected to an output end and a loop end of the radio frequency matcher 120. Meanwhile, the base 10 is fixed to the bottom wall 1002 of the chamber body via the retractable sealing part 140, such that the upper surface of the lower electrode 105 is hermetically sealed in the accommodation space where the chamber body 100 is accommodated; on the chamber body 100 is connected an electrical connection part 160 via which radio frequency current in the chamber body returns to the loop end of the radio frequency matcher 120.

In the present disclosure, the chamber body is fixed; the lower electrode is fixed on the chamber body via the retractable sealing part, such that when the lower electrode is driven by the driving means to move up/down, the chamber body does not move along with it, and the radio frequency loop in the chamber body is in a steady state, thereby achieving stability of the radio frequency loop while achieving adjustability of the plate distance.

Particularly, the upper electrode 102 is an electrode disposed at the upper portion of the chamber body 100; the upper electrode 102 is also referred to as a showerhead; an air inlet (not shown) is generally provided on an end face of the upper electrode 102 outside the reaction chamber, and a vent hole 106 is generally provided on an end face inside the reaction chamber; the process gas enters the upper electrode 102 via the air inlet and is transmitted into the reaction chamber via the vent hole 106.

The lower electrode 105 is connected to the output end of the radio-frequency matcher 120 sequentially through the electrically conductive supporting rod 110 and the driving means 124; further, a radio frequency filter 122 can be optionally electrically connected between the driving means 124 and the radio frequency matcher 120, wherein the radio-frequency matcher 120 is connected to a radio-frequency power supply (not shown) so as to supply radio-frequency power to the lower electrode 105.

In some embodiments, the lower electrode 105 can be connected to one or more radio-frequency matchers 120, e.g., 2 radio-frequency matchers. In an embodiment wherein the lower electrode 105 is connected to a plurality of radio-frequency matchers, each radio-frequency matcher may supply a radio frequency and power different from those supplied by other radio-frequency matchers so as to be adapted to the requirements of different processes. In such embodiments, the upper electrode 102 can be grounded. In some other embodiments, the lower electrode 105 can be connected to a radio-frequency matcher, and the upper electrode can be connected to another radio-frequency matcher; the two radio-frequency matchers may supply different frequencies and powers.

The lower electrode 105 may further serve as a support structure for the wafer. A temperature control device (not shown) can be disposed in the lower electrode or in a dielectric material layer above the lower electrode, for providing an appropriate temperature to the wafer; the temperature control device can be a joule heat device, e.g., implementing temperature control via; it may also be a heat conduction passage, e.g., implementing temperature control via the coolant in the heat conduction passage; temperature control devices can be arranged by partition, such that the temperatures of different regions of the wafer can be separately controlled, thereby implementing uniform temperature control.

In an embodiment of the present disclosure, the lower electrode 105 is connected to a radio frequency source, serving as a radio-frequency power output end; the upper electrode 102 and the chamber body 100 can be grounded; the chamber body 100, or the chamber body and some other accessories electrically connected to the chamber body, may serve as a return path for the radio-frequency power. Specifically, as shown by the dashed line in FIG. 1, the radio-frequency power is outputted from the output end of the radio-frequency matcher 120, and after sequentially passing through the radio frequency filter 122, the driving means 124, and the electrically conductive supporting rod 110, enters the lower electrode 105; after the process gas is introduced into the chamber body 100 via the upper electrode 102, under the action of the radio-frequency power, plasma is generated in the space between the upper electrode 102 and the lower electrode 105, i.e., in the space above the lower electrode 105; the radio-frequency current returns to the loop end of the radio-frequency matcher via the return path in the chamber body 100; dependent on different chamber body structures and different design requirements, the return path can be configured differently.

The radio-frequency matcher 120, which is connected to a radio frequency source, is configured for outputting a desired radio-frequency power; the radio-frequency matcher 120 has an output end and a loop end, wherein the output end is configured for outputting a radio frequency, and the loop end is configured for receiving the returned radio frequency. The radio frequency filter 122 is connected to the radio frequency matcher 120; the radio frequency filter 122 is configured for filtering interference frequency signals; the radio frequency filter 122 is electrically connected to the driving means 124; the driving means 124 supplies an axial drive force to the electrically conductive supporting rod 110; the above components can be electrically connected via an electrically conductive housing or other accessory parts and thus may serve as the output path and return path for the radio frequency current.

The reaction chamber of the plasma etching apparatus is a hermetically sealed space enclosed by the chamber body 100 and other essential components, such that the wafer may completely undergo the etching process in the vacuum environment of the reaction chamber. In the present disclosure, an upper electrode 102 is disposed at the top of the chamber body 100; the upper electrode 102 can be optionally disposed inside the chamber body 100, implementing sealing of the top of the chamber body 100 through other members, such as an upper cover plate; the upper electrode 102 may optionally be inlaid in the top of the chamber body 100. Here, the dispositions of the upper electrode are only exemplary, and the present disclosure has no limitation on disposition of the upper electrode 102 or sealing of the top of the chamber body 100.

In an embodiment of the present disclosure, the chamber body 100 comprises a side wall 1001 and a bottom wall 1002; the lower electrode 105 is disposed above an opening, such that the electrically conductive supporting rod 110 may move up/down at the opening position. A retractable sealing part 140 is fixedly connected between the base 100 and the bottom wall 1002; the retractable sealing part 140 is made of a dielectric material, which, for example, can be a bellow for the purpose of sealing; the retractable sealing part 140 is configured for hermetically sealing the upper surface of the lower electrode 105 in the accommodation space where the cavity 100 is accommodated; besides, the retractable sealing part 140 is extended or retracted in the axial direction of the electrically conductive supporting rod 110; in other words, the retractable sealing part 140 has the same movement direction as the electrically conductive supporting rod 110; here, the upper surface of the lower electrode 105 is the surface facing the upper electrode 102. In this way, when the electrically conductive supporting rod 110 is driven to move up/down, the retractable sealing part 140 will be extended or retracted along with the lower electrode; further, the lower electrode 105 is hermetically sealed in the chamber body 100 via the retractable sealing part 140. It can be understood that the retractable sealing part 140 can be directly or indirectly fixed with the lower electrode; when the base 10 is further provided with other components, the retractable sealing part 140 may cooperate with other components to implement sealing of the bottom of the chamber body, such that the surface of the lower electrode 105 facing the upper electrode 102 is disposed in the hermetically sealed chamber.

In the embodiments of the present disclosure, an electrical connection part 160 is further provided on the chamber body 100; the electrical connection part 160 is configured for the radio frequency current in the chamber body 100 to return to the loop end of the radio frequency matcher 120. In other words, the electrical connection part 160 serves as part of the return path for the radio frequency current; in a specific application, the electrical connection part 160 can be connected outside the accommodation space where the chamber body 100 is accommodated, e.g., connected to the outer side of the bottom wall 1002 of the chamber body so as to avoid the electrical connection part 160 from interfering with the radio frequency current; further, the electrical connection part 160 can be directly or indirectly connected to the radio frequency matcher 120 so as to enable the radio frequency current to return to the loop end of the radio matcher.

In some embodiments, the base 10 further comprises a dielectric ring 132 fixed at the outer side of the lower electrode and an inner electrically conductive ring 136 fixed at the outer side of the dielectric ring, wherein the outer side of the inner electrical conductive ring 136 is the radio frequency return path at the inner side of the chamber body, the inner electrically conductive ring 136 is fixed to the bottom wall 1002 of the chamber body via the retractable sealing part 140; the electrical connection part 160 is an electrically conductive strip, wherein the electrically conductive strip is connected between the bottom wall 1002 of the chamber body and the inner electrically conductive ring 136, the length of the electrically conductive strip is adapted to the movable amount of the retractable sealing part 140, and a gap is provided between the inner electrically conductive ring 140 and the radio frequency return path at the inner side of the chamber body 100. In this way, as shown by the dash line in FIG. 1, the radio frequency current from the return path in the chamber body 100, after flowing through the electrically conductive strip 160 and then sequentially through the outer side and the inner side of the inner electrically conductive ring 136, returns from the driving means 124 to the loop end of the radio frequency matcher 120.

In the present disclosure, the inner electrically conductive ring 136 is connected onto the chamber body via the electrically conductive strip 160, causing the inner electrically conductive ring 136 and the chamber body 100 to have equal potentials; the inner electrically conductive ring 136 isolates the lower electrode 105 from the radio frequency field in the radio frequency return path at the outer side of the lower electrode 105; in this way, as the lower electrode 105 moves, the inner electrically conductive ring 136 moves up/down along with the lower electrode 105; during movement of the lower electrode 105, the radio frequency field of the lower electrode 105 is avoided from affecting the radio frequency field of the surrounding radio frequency return path, and the radio frequency field of the lower electrode is avoided from causing instability of the radio frequency loop, thereby maintaining stability of the radio frequency loop while achieving adjustability of the plate distance.

In this embodiment, the dielectric ring 132 is fixed to the lower electrode 105, and the inner electrically conductive ring 136 is fixed to the dielectric ring 132 and then fixed, via the retractable sealing part 140, onto the bottom wall 1002 of the chamber body, such that the upper surface of the lower electrode 105 is hermetically sealed in the accommodation space where the chamber body 100 is accommodated; as shown in FIG. 1, the hermetical space in the lower portion of the chamber body 100 is enclosed by the side wall 1001 and the bottom wall 1002 of the chamber body 100, the inner wall of the retractable sealing part 140, and the side wall of the inner electrically conductive ring 136, such that the upper surface of the lower electrode 105 is disposed in the chamber body 100, while the lower surface of the upper electrode 105 and the electrically conductive supporting rod 110 are disposed outside the chamber body 100; a vacuum environment is provided in the chamber body 100 for undergoing the etching process.

The dielectric ring 132 is made of a dielectric material, e.g., a ceramic material, to electrically isolate the lower electrode 105 from the inner electrically conductive ring 136.

The inner electrically conductive ring 136 is an electrically conductive material; the inner electrically conductive ring 136 is connected to the bottom wall 1002 of the chamber body via an electrically conductive strip 160. The length of the electrically conductive strip is adapted to a movable amount of the retractable sealing part 140; the electrically conductive strip 160 can be a flexible electrically conductive material, e.g., metal copper. The length of the electrically conductive strip 160 has a certain margin, such that when the retractable sealing part 140 is extended or retracted up/down, a good electrical connection state can be still maintained between the electrically conductive ring and the chamber body.

A radio frequency return path at the inner side of the chamber body is disposed at the outer side of the inner electrically conductive ring 136; the radio frequency return path is configured for the radio frequency power to return; the radio frequency return path can be provided by the side wall 1002 of the chamber body, which may also be provided by other components in the chamber body. In the embodiment, a grounding ring 101 is further provided in the chamber body 100; the grounding ring is an electrically conductive material, which serves as part of the radio frequency return path. The grounding ring 101 is disposed at the outer side of the inner electrically conductive ring 136; a gap is provided between the grounding ring and the inner electrically conductive ring; the inner electrically conductive ring 136 is configured for shielding the radio frequency interference between the lower electrode and the grounding ring 101. The grounding ring 101 and the chamber body 100 form a cavity 103; the cavity 103 can be configured to form an exhaust cavity; a plasma confinement ring 134 can be disposed on the cavity 103; the exhaust cavity is formed via the plasma confinement ring 134, the grounding ring 101, and the chamber body 100; meanwhile, the plasma confinement ring 134 includes an electrically conductive part. Particularly, the grounding ring 101 is an electrically conductive isolation wall. On the one hand, the grounding ring 101 may serve as a radio frequency return path; on the other hand, it transversely isolates out a space for the exhaust cavity; the plasma confinement ring 134 is a gas permeated structure, so as to quench the extra plasma inside the chamber body and cause the exhaust gas to enter the exhaust cavity; the exhaust cavity is generally further provided with an air pump, via which the exhaust gas in the chamber is pumped out.

In this embodiment, as shown in FIG. 1, after the radio frequency current passes through the plasma confinement ring 134 from the side wall 1002 of the chamber body, it enters the grounding ring 101; in this way, the return path for the radio frequency current is implemented by necessary components such as the exhaust cavity in the chamber and the plasma confinement ring, which may effectively shorten the radio frequency current return path. In the specific example, the plasma confinement ring 134 is a laminated structure, comprising a lower electrically conductive part and an upper dielectric material layer from bottom to top; as shown in the dashed line in FIG. 1, the radio frequency current from the side wall 1002 of the chamber body enters the grounding ring 101 along the lower electrically conductive layer of the plasma ring 134.

The grounding ring 101 is connected on the bottom wall 1002; the electrically conductive strip 160 is also disposed on the bottom wall 1002; in this way, as shown by the dashed line in FIG. 1, after flowing through the electrically conductive strip 160 from the bottom wall 1002, the radio frequency current sequentially flows through the outer side and the inner side of the inner electrically conductive ring 160 and then returns, from the bottom wall 1002 of the chamber body, to the loop end of the matcher 120.

An electrostatic chuck (ESC) 107 can be further provided on the lower electrode 105, for adsorbing the wafer; the electrostatic chuck 107 can be disposed in the dielectric material layer; the dielectric material, for example, can be a ceramic material. As shown in FIG. 1, the central area of the lower electrode 105 is higher than the edge area; the central area for supporting the wafer has a shape and a size substantially identical to the wafer; the electrostatic chuck 107 is disposed above the central area; the dielectric ring 132 surrounds the edge area, the edge of the lower electrode 105, and the lower portion region of the lower electrode 105, and extends till to the outer side of the retractable sealing part 140.

Moreover, a focus ring 130 surrounding the electrostatic chuck 107 is further provided on the dielectric ring 132; the focus ring 130 is configured for preventing arc discharging. In the specific example, as shown in FIG. 1, the focus ring 130 has a flared oblique face proximal to the upper portion of the inner wall of the electrostatic chuck 107; an outer edge of the focus ring 130 proximal to the electrostatic chuck 107 is a recessed region, the recessed region being adaptable for disposing an edge ring 138.

What have been described above are only preferred embodiments of the present disclosure. Although the present disclosure has been described with preferred embodiments, such preferred embodiments are not intended to limit the present disclosure. Any skilled in the art may make various possible alternations and modifications to the technical solution of the present disclosure using the method and technical content revealed above without departing from the scope of the present disclosure, or modify them as equivalent embodiments. Therefore, any simple alternations, equivalent changes and modifications to the above embodiments based on the substance of the present disclosure without departing from the contents of the technical solution of the present disclosure still fall within the protection scope of the present disclosure.

We claim:

1. A capacitively coupled plasma etching apparatus, comprising:
   a chamber body, which includes a side wall and a bottom wall, the bottom wall having an opening;
   an upper electrode disposed in the chamber body;
   a base arranged opposite to the upper electrode and disposed in the chamber body, the base comprising a lower electrode, the lower electrode being fixed to an electrically conductive supporting rod and disposed above the opening, the electrically conductive supporting rod being movable axially and the base being fixed to the bottom wall of the chamber body via a retractable sealing part, causing an upper surface of the lower electrode to be hermetically sealed in an accommodation space where the chamber body is accommodated;
   the base further comprising a dielectric ring fixed to an outer side of the lower electrode and an inner electrically conductive ring fixed to the outer side of the dielectric ring, the inner electrically conductive ring is fixed to the retractable sealing part, the retractable sealing part is made of a dielectric material;

the electrically conductive support rod being electrically connected to an output end of a radio frequency matcher and to the lower electrode; and an electrical connection part connected to the chamber body, radio frequency current in the chamber body returning, via the electrical connection part, to a loop end of the radio frequency matcher;

wherein, the electrically connection part is an electrically conductive strip, the electrically conductive strip being connected between an outer side of the bottom wall of the chamber body and the inner electrically conductive ring, a length of the electrically conductive strip being adapted to a movable amount of the retractable sealing part; and wherein a gap being provided between the inner electrically conductive ring and a radio frequency return path disposed at an inner side of the chamber body; the radio frequency current flows through the electrically conductive strip, then sequentially through an outer side and an inner side of the inner electrically conductive ring, and then returns to the loop end.

2. The apparatus according to claim 1, further comprising a grounding ring, the grounding ring being disposed on the bottom wall of the chamber body, a cavity being provided between the grounding ring and the side wall, and the grounding ring being part of the radio frequency return path.

3. The apparatus according to claim 2, further comprising a plasma confinement ring disposed above the cavity, the plasma confinement ring and the cavity forming an exhaust cavity; and the plasma confinement ring comprises an electrically conductive part, the electrically conductive part causing the radio frequency current to enter the grounding ring from the side wall of the chamber body through the plasma confinement ring.

4. The apparatus according to claim 1, wherein the electrically conductive strip is a copper strip.

5. The apparatus according to claim 1, wherein the retractable sealing part is a bellow seal.

6. The apparatus according to claim 1, wherein an electrostatic chuck is disposed on the lower electrode, the dielectric ring surrounding a side wall of the lower electrode, and a focus ring surrounding the electrostatic chuck is further provided on the dielectric ring.

7. The apparatus according to claim 6, further comprising an edge ring surrounding the focus ring.

8. The apparatus according to claim 1, wherein the radio frequency matcher is provided in one or plurality, the plurality of radio frequency matchers having different frequencies and powers.

9. The apparatus according to claim 1, further comprising a radio frequency filter, the radio frequency filter being electrically connected between the electrically conductive supporting rod and the radio frequency matcher so as to serve as a radio frequency current output path and the radio frequency return path.

* * * * *